(12) United States Patent
Kim et al.

(10) Patent No.: US 7,727,787 B2
(45) Date of Patent: Jun. 1, 2010

(54) NITRIDE SEMICONDUCTOR LIGHT EMITTING DEVICE AND METHOD OF MANUFACTURING THE SAME

(75) Inventors: Tae Jun Kim, Gyunggi-do (KR); Su Yeol Lee, Gyunggi-do (KR); Dong Woo Kim, Seoul (KR); Hyun Ju Park, Gyunggi-do (KR); Hyoun Soo Shin, Seoul (KR); In Joon Pyeon, Gyunggi-do (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 333 days.

(21) Appl. No.: 11/976,791

(22) Filed: Oct. 29, 2007

(65) Prior Publication Data

US 2008/0105889 A1 May 8, 2008

(30) Foreign Application Priority Data

Nov. 3, 2006 (KR) ...................... 10-2006-0108553

(51) Int. Cl.
*H01L 21/304* (2006.01)
(52) U.S. Cl. ................ 438/29; 438/46; 438/E21.04
(58) Field of Classification Search ................ 438/29, 438/34, 46, E21.04
See application file for complete search history.

(56) References Cited

U.S. PATENT DOCUMENTS

| 7,160,744 B2 * | 1/2007 | Park et al. ...................... 438/29 |
| 7,332,365 B2 * | 2/2008 | Nakamura et al. ............ 438/29 |
| 2005/0202581 A1 * | 9/2005 | Sugawara ...................... 438/39 |
| 2006/0163586 A1 | 7/2006 | Denbaars et al. |
| 2006/0225644 A1 | 10/2006 | Lee et al. |
| 2008/0042149 A1 * | 2/2008 | Yoon et al. ...................... 257/79 |
| 2008/0061315 A1 * | 3/2008 | Hata ............................ 257/99 |

FOREIGN PATENT DOCUMENTS

| JP | 2004-296702 | 10/2004 |
| JP | 2004296702 A | * 10/2004 |
| KR | 10-2006-0097512 | 9/2006 |

OTHER PUBLICATIONS

Chinese Office Action, with English Translation, issued in Chinese Patent Application No. CN 2007101659.8 dated on Oct. 10, 2008.

* cited by examiner

*Primary Examiner*—Allan R. Wilson
(74) *Attorney, Agent, or Firm*—McDermott Will & Emery LLP

(57) ABSTRACT

There are provided a method of manufacturing a nitride semiconductor light emitting device and the nitride semiconductor light emitting device manufactured by the method, the method including: forming a light emitting structure by sequentially growing a first conductivity nitride layer, an active layer and a second conductivity type nitride layer on a preliminary substrate for nitride single crystal growth; separating the light emitting structure in accordance with a size of final light emitting device; forming a conductive substrate on the light emitting structure; polishing a bottom surface of the preliminary substrate to reduce a thickness of the preliminary substrate; forming uneven surface structures by machining the preliminary substrate; selectively removing the preliminary substrate to expose portions of the first conductivity type nitride layer; and forming electrodes on the portions of the first conductivity type nitride layer exposed by selectively removing the preliminary substrate.

14 Claims, 3 Drawing Sheets

NITRIDE SEMICONDUCTOR LIGHT EMITTING DEVICE AND METHOD OF MANUFACTURING THE SAME

CLAIM OF PRIORITY

This application claims the benefit of Korean Patent Application No. 2006-0108553 filed on Nov. 3, 2006, in the Korean Intellectual Property Office, the disclosure of which is incorporated herein by reference.

BACKGROUND OF THE INVENTION

1. Field of the Invention

The present invention relates to a method of manufacturing a nitride semiconductor light emitting device, and more particularly, to a method of manufacturing a nitride semiconductor light emitting device, the method minimizing deformation of and thermal damage to a light emitting structure in a process of removing a substrate from the light emitting structure, thereby improving the light extraction efficiency, and to a nitride semiconductor light emitting device manufactured by the method.

2. Description of the Related Art

In general, the nitride single crystals constituting a group III nitride semiconductor light emitting device are formed on a particular substrate for single-crystal growth such as a sapphire or SiC substrate. However, using an insulating substrate such as a sapphire substrate greatly restricts the arrangement of electrodes. That is, in the conventional nitride semiconductor light emitting device, the electrodes are arranged horizontally, narrowing the current flow. Due to such narrow current flow, the forward voltage Vf of the light emitting device increases, decreasing the current efficiency of the device and rendering the device vulnerable to electrostatic discharge.

To solve such a problem, a nitride semiconductor light emitting device having a vertical structure is required. However, the nitride semiconductor light emitting device requires a process of removing an insulating substrate such as a sapphire substrate to form electrodes on upper and lower surfaces thereof.

FIG. 1 is a cross-sectional view illustrating a process of removing a sapphire substrate from a light emitting structure according to the prior art. As shown in FIG. 1, the sapphire substrate 11 is removed by a laser lift-off process after attaching a conductive substrate 14 on a nitride single-crystal light emitting structure 12 by using a conductive adhesive layer 13. However, the sapphire has a thermal expansion coefficient of about $7.5 \times 10^{-6}$/K whereas the GaN single crystal, which is the main material of the light emitting structure 12, has a thermal expansion coefficient of about $5.9 \times 10^{-6}$/K. Therefore, a lattice mismatch of about 16% occurs.

Due to such a lattice mismatch, the heat generated from a process of emitting a laser beam to the sapphire substrate 11 is transferred laterally along the sapphire substrate 11. Therefore, thermal stress is generated along the interface of the sapphire substrate 11 and the light emitting structure 12, which problematically increases the likelihood of damage to the nitride single crystals. This resultantly degrades the luminance and reliability of the nitride semiconductor light emitting device.

SUMMARY OF THE INVENTION

An aspect of the present invention provides a method of manufacturing a nitride semiconductor light emitting device, the method allowing stable removal of a substrate from a light emitting structure, thereby improving the luminance and reliability of a nitride semiconductor light emitting device, and a nitride semiconductor light emitting device manufactured by the method.

According to an aspect of the invention, there is provided a method of manufacturing a nitride semiconductor light emitting device, the method including: forming a light emitting structure by sequentially growing a first conductivity nitride layer, an active layer and a second conductivity type nitride layer on a preliminary substrate for nitride single crystal growth; separating the light emitting structure in accordance with a size of final light emitting device; forming a conductive substrate on the light emitting structure; polishing a bottom surface of the preliminary substrate to reduce a thickness of the preliminary substrate; forming uneven surface structures by machining a surface of the preliminary substrate; selectively removing the preliminary substrate to expose portions of the first conductivity type nitride layer; and forming electrodes on the portions of the first conductivity type nitride layer exposed by the selectively removing the preliminary substrate.

The preliminary substrate may be retained through the selectively removing the preliminary substrate, rather than being entirely removed by a laser lift-off process, thereby minimizing thermal damage potentially caused by using the laser lift-off process.

The forming uneven surface structures by machining a surface of the preliminary substrate may include a polishing process performed in the polishing a bottom surface of the preliminary substrate. Therefore, the uneven surface structures formed in the polishing process may be employed in the device rather than being removed, thereby improving the extraction efficiency of the light emitting device.

The method may further include applying an ion injection process to the bottom surface of the preliminary substrate to destroy crystallinity of the preliminary substrate before polishing a bottom surface of the preliminary substrate. By injecting ions of a large radius, for example, Ar, Kr, Xe, Si, O, Ga, Cs and the like, the crystallinity of the preliminary substrate is destroyed and the substrate becomes soft, thereby facilitating the polishing process on the preliminary substrate.

The method may further include applying an ion injection process to the bottom surface of the preliminary substrate to destroy crystallinity of the preliminary substrate before the forming uneven surface structures by machining a surface of the preliminary substrate. The ion injection facilitates formation of the uneven surface structures.

In the forming uneven surface structures by machining a surface of the preliminary substrate, the uneven surface structures may be formed by the polishing process and also may be formed in a remaining portion of the preliminary substrate, after the forming electrodes.

The uneven surface structures formed in the preliminary substrate, employed in the present invention, serves to adjust the incident angle of light emitted from the active layer to increase an amount of light emitted externally without being internally reflected. The forming uneven surface structures by machining a surface of the preliminary substrate may include a wet etching process. In this case, to facilitate the wet etching process, the method may further include applying an ion injection process to the bottom surface of the preliminary substrate to destroy crystallinity of the preliminary substrate, before the wet etching process.

The polishing a bottom surface of the preliminary substrate may be performed such that the preliminary substrate has a decreased thickness of 50 to 200 μm, which is to facilitate removing portions of the preliminary substrate as described later.

The separating the light emitting structure may include separating the light emitting structure in accordance with a size of a final light emitting device such that a portion of the first conductivity nitride layer remains on the preliminary substrate.

The method may further include: forming an undoped GaN layer on the preliminary substrate before the forming a light emitting structure on the preliminary substrate; and removing exposed portions of the undoped GaN layer after the selectively removing portions of the preliminary substrate. This is because when employing the undoped GaN layer, the electrodes may be formed on the first conductivity type nitride layer after removing the undoped GaN layer, due to crystallinity and the like.

The forming a conductive substrate on the light emitting structure may include attaching the conductive substrate on the light emitting structure by using a conductive adhesive layer. However, the present invention is not limited thereto, and a metal plating layer may be employed instead of the conductive substrate.

According to another aspect of the invention, there is provided a nitride semiconductor light emitting device including: a conductive substrate; a light emitting structure including a second conductivity nitride layer, an active layer and a first conductivity type nitride layer sequentially formed on the conductive substrate; an electrode formed on one portion of the first conductivity type nitride layer; and a light scattering layer formed on the other portion of the first conductivity type nitride layer, the light scattering layer formed of a material of a substrate for nitride single crystal growth and having an upper surface in which uneven surface structures are formed.

The light scattering layer corresponds to the preliminary substrate in the above-described method and may particularly have electric insulating properties. Therefore, the light scattering layer may be formed of a material selected from a group consisting of sapphire, SiC, $MgAl_2O_4$, MgO, $LiAlO_2$ and $LiGaO_2$. In addition, since the light scattering layer may serve to scatter the light emitted from the active layer with the uneven surface structures formed therein, it may be formed of a transparent material.

The conductive substrate may be formed of a material selected from a group consisting of Si, Ge, SiC, ZnO and GaAs, and the electrode may be formed of a material selected from a group consisting of Cr, Au, Ti, Al, Rh, Pt, Ni, W, Ir, V, ITO, CIO, IZO and a combination thereof.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings.

FIGS. 2A to 2G are cross-sectional views illustrating a method of manufacturing a nitride semiconductor light emitting device according to an exemplary embodiment of the present invention.

Figure 1:
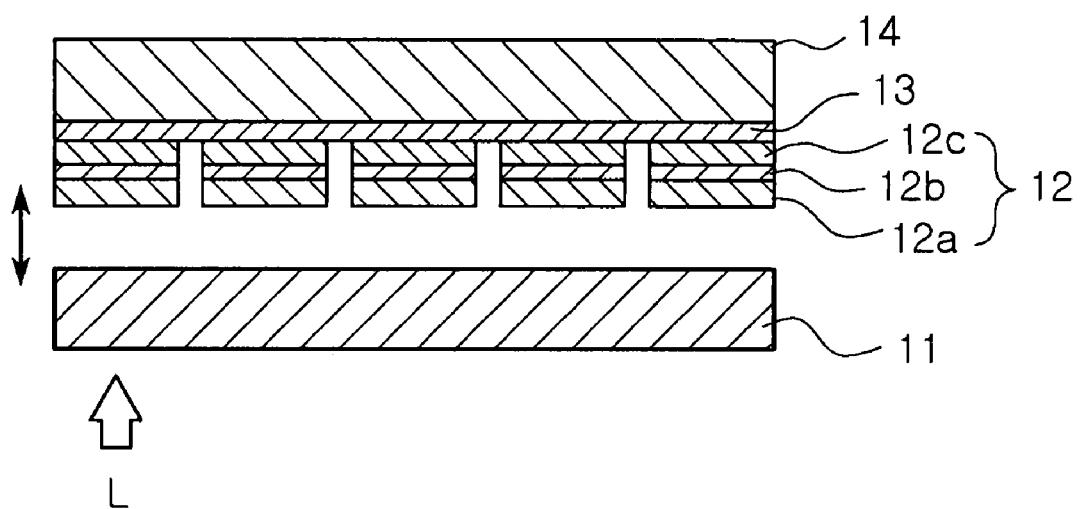
FIG. 1 is a cross-sectional view illustrating a process of removing a sapphire substrate from a light emitting structure according to the prior art.
Figure 2A:
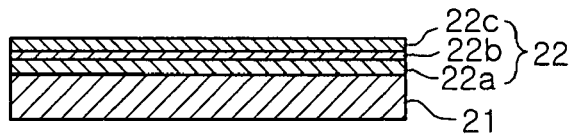
FIGS. 2A to 2G are cross-sectional views illustrating a method of manufacturing a nitride semiconductor light emitting device according to an exemplary embodiment of the present invention.

As shown in FIG. 2A, a light emitting structure 22 is grown on a preliminary substrate 21 for growing nitride single crystals. In this case, the preliminary substrate 21 may be a sapphire substrate but is not limited thereto and may be a substrate formed of a material selected from a group consisting of SiC, Si, $MgAl_2O_4$, MgO, $LiAlO_2$ and $LiGaO_2$. The light emitting structure 22 is formed by growing a first conductivity type nitride layer 22a on the preliminary substrate 21 and sequentially growing an active layer 22b and a second conductivity type nitride layer 22c on the first conductivity type nitride layer 22a. In general, the light emitting structure 22 may be formed by a process such as metal organic chemical vapor deposition (MOCVD), molecular beam epitaxy (MBE), hydride vapor phase epitaxy (HVPE).

Figure 2B:
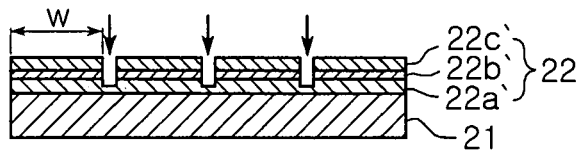

Then, as shown in FIG. 2B, the light emitting structure 22 is separated in accordance with a size W of a final light emitting device. In this case, the light emitting structure 22a may be separated such that a portion of the first conductivity type nitride layer 22a remains on the preliminary substrate 21. The remaining portion of the first conductivity nitride layer may facilitate cutting into individual light emitting device units described later.

Figure 2C:
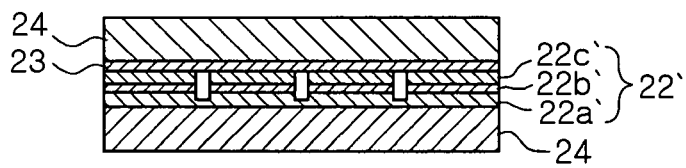

Then, as shown in FIG. 2C, a conductive substrate 24 is formed on the separated light emitting structure 22'. The conductive substrate 24 is a permanent substrate supporting the light emitting structure 22, and is attached on the separated light emitting structure 22' by using a conductive adhesive layer 23. However, this does not limit the present invention, and for example, a metal seed layer may be deposited on the separated light emitting structure 22' and a metal plating layer (not shown) may be formed on the metal seed layer.

Figure 2D:
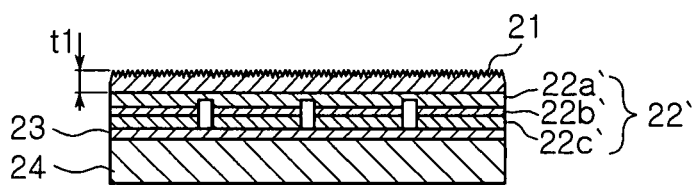

Then, as shown in FIG. 2D, a bottom surface of the preliminary substrate 21 is polished to reduce a thickness thereof. In addition, uneven surface structures D may be formed in the bottom surface of the preliminary substrate 21 in the process of polishing the bottom surface of the preliminary substrate 21.

This is to retain a portion of the preliminary substrate except portions corresponding to areas of the first conductivity type nitride layer 22a', on which electrodes are to be formed, rather than entirely removing the preliminary substrate 21. In this case, a laser lift-off process for removing the preliminary substrate 21 is omitted, minimizing thermal damage to the light emitting structure, thereby improving the luminance and reliability of the nitride semiconductor light emitting device manufactured according to this embodiment. Therefore, to easily remove the portions of the preliminary substrate corresponding to the areas of the first conductivity type nitride layer 22a' on which the electrodes are to be formed, the preliminary substrate 21 needs to be polished to a suitably small thickness. In this case, the preliminary substrate 21 may have a decreased thickness t1 of 50 to 200 μm. This is a thickness range suitably determined in consideration that the light extraction efficiency is improved with a small thickness but too small a thickness may be a cause of bending.

In this case, although not illustrated, the bottom surface of the preliminary substrate 21 may be polished by both mechanical and chemical processes, and particularly, by inductively coupled plasma (ICP).

In addition, as described above, the uneven surface structures D formed in the polishing process do not need to be removed but are employed in the light emitting device to improve the light extraction efficiency of the device.

Although not shown, the process of polishing and forming the uneven surface structures D of the preliminary substrate 21 may be performed after destroying the crystallinity of the preliminary substrate 21 by applying an ion injection process to the bottom surface of the preliminary substrate 21.

In the meantime, FIG. 2D illustrates the uneven surface structures formed in the process of polishing the bottom surface of the preliminary substrate 21 and illustrates the preliminary substrate in a reversed structure from those in FIGS. 2A to 2C. Therefore, the bottom surface of the preliminary substrate polished becomes the top surface of the preliminary substrate 21 in FIG. 2D.

Figure 2E:
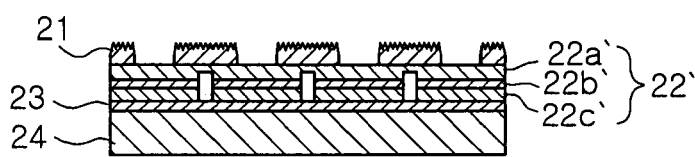
Figure 2F:
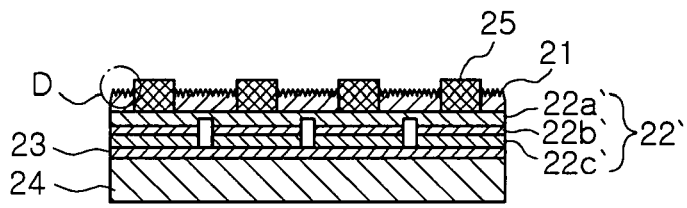

Then, as shown, in FIGS. 2E and 2F, the preliminary substrate 21 is selectively removed and electrodes 25 are formed.

Figure 2G:
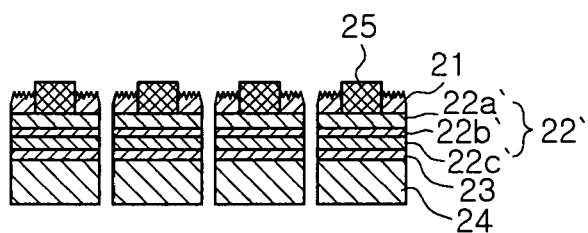

Lastly, as shown in FIG. 2G, the resultant structure is cut into individual light emitting device units to obtain final vertical structure nitride semiconductor light emitting devices. In general, the conductive substrate 24 may be a Si substrate having a smaller rigidity than a sapphire substrate typically used for a preliminary substrate 21, and thus may be easily cut through a general cutting process.

Figure 3:
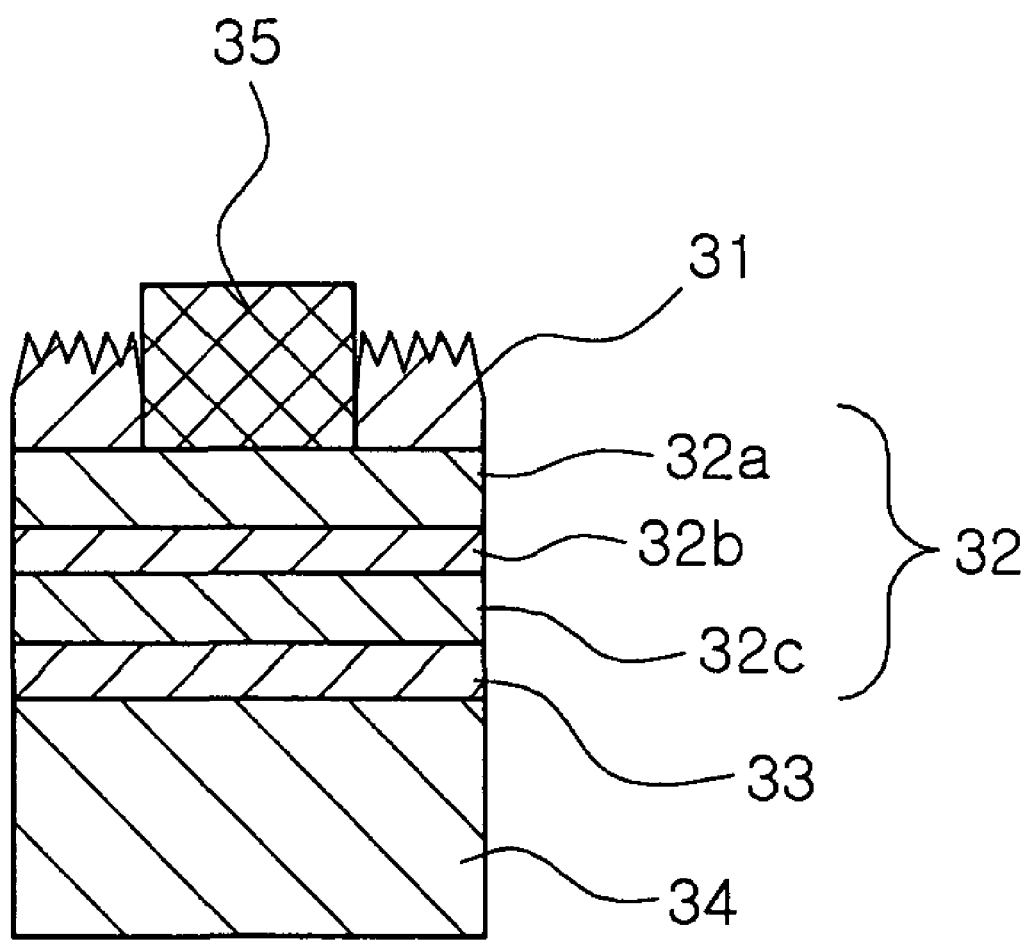
FIG. 3 is a cross-sectional view illustrating a nitride semiconductor light emitting device according to an exemplary embodiment of the present invention.

FIG. 3 is a cross-sectional view illustrating a nitride semiconductor light emitting device 30 according to an exemplary embodiment of the present invention, showing an enlarged view of one of the above-described final vertical structure nitride semiconductor light emitting devices. Referring to FIG. 3, the nitride semiconductor light emitting device 30 includes a conductive substrate 34, a light emitting structure including a second conductivity type nitride layer 32c, an active layer 32b and a first conductivity type nitride layer 32a sequentially formed on the first conductivity type nitride layer 32a, an electrode formed on one portion of the first conductivity type nitride layer 32a, and a light scattering layer 31 formed on the other portion of the first conductivity type nitride layer 32a, the light scattering layer 31 formed of a material of a substrate for nitride singly crystal growth and having an upper surface in which uneven surface structures are formed.

In this case, the light scattering layer 31 corresponds to the remaining portion of the preliminary substrate, in which the uneven surface structures are formed. The light scattering layer 31 is formed by polishing the preliminary substrate 21, forming the uneven surface structures and removing portions of the preliminary substrate 21. In this case, the light scattering layer 31 may be formed in a small thickness of 50 to 200 μm, identical to the thickness of the preliminary substrate 21, by a polishing process.

In addition, the light scattering layer 31 functions to scatter the light emitted from the active layer 32b, thereby reducing an amount of light internally reflected and disappearing eventually.

As set forth above, the method according to the present invention minimizes deformation of the light emitting structure and thermal damage to the light emitting structure in the process of removing the substrate from the light emitting structure, thereby improving the capacity, i.e., the luminance and reliability of the device and ultimately the light extraction efficiency of the light emitting device.

While the present invention has been shown and described in connection with the exemplary embodiments, it will be apparent to those skilled in the art that modifications and variations may be made without departing from the spirit and scope of the invention as defined by the appended claims.

What is claimed is:

1. A method of manufacturing a nitride semiconductor light emitting device, the method comprising:
   forming a light emitting structure by sequentially growing a first conductivity nitride layer, an active layer and a second conductivity type nitride layer on a preliminary substrate for nitride single crystal growth;
   separating the light emitting structure in accordance with a size of final light emitting device;
   forming a conductive substrate on the light emitting structure;
   polishing a bottom surface of the preliminary substrate to reduce a thickness of the preliminary substrate;
   forming uneven surface structures by machining a surface of the preliminary substrate;
   selectively removing the preliminary substrate to expose portions of the first conductivity type nitride layer; and
   forming electrodes on the portions of the first conductivity type nitride layer exposed by the selectively removing the preliminary substrate.

2. The method of claim 1, wherein the forming uneven surface structures by machining a surface of the preliminary substrate is comprises a polishing process performed in the polishing a bottom surface of the preliminary substrate.

3. The method of claim 1, further comprising applying an ion injection process to the bottom surface of the preliminary substrate to destroy crystallinity of the preliminary substrate before the polishing a bottom surface of the preliminary substrate.

4. The method of claim 1, further comprising applying an ion injection process to the bottom surface of the preliminary substrate to destroy crystallinity of the preliminary substrate before the forming uneven surface structures by machining a surface of the preliminary substrate.

5. The method of claim 1, wherein the forming uneven surface structures by machining a surface of the preliminary substrate comprises forming uneven surface structures in a remaining portion of the preliminary substrate, after the forming electrodes.

6. The method of claim 1, wherein the forming uneven surface structures by machining a surface of the preliminary substrate comprises a wet etching process.

7. The method of claim 6, further comprising applying an ion injection process to the bottom surface of the preliminary substrate to destroy crystallinity of the preliminary substrate, before the wet etching process.

8. The method of claim 1, wherein the polishing a bottom surface of the preliminary substrate is performed such that the preliminary substrate has a decreased thickness of 50 to 200 μm.

9. The method of claim 1, further comprising:
   forming an undoped GaN layer on the preliminary substrate before the forming a light emitting structure on the preliminary substrate; and
   removing exposed portions of the undoped GaN layer after the selectively removing portions of the preliminary substrate.

10. The method of claim 1, wherein the separating the light emitting structure comprises separating the light emitting structure in accordance with a size of a final light emitting device such that a portion of the first conductivity nitride layer remains on the preliminary substrate.

11. The method of claim 1, wherein the forming a conductive substrate on the light emitting structure comprises attaching the conductive substrate on the light emitting structure by using a conductive adhesive layer.

12. The method of claim 1, wherein the preliminary substrate is formed of a material selected from a group consisting of sapphire, SiC, $MgAl_2O_4$, MgO, $LiAlO_2$ and $LiGaO_2$.

13. The method of claim 1, wherein the conductive substrate is formed of a material selected from a group consisting of Si, Ge, SiC, ZnO and GaAs.

14. The method of claim 1, wherein the electrodes are formed of a material selected from a group consisting of Cr, Au, Ti, Al, Rh, Pt, Ni, W, Ir, V, ITO, CIO, IZO and a combination thereof.

* * * * *